United States Patent [19]

Luryi

[11] Patent Number: 4,806,996
[45] Date of Patent: Feb. 21, 1989

[54] DISLOCATION-FREE EPITAXIAL LAYER ON A LATTICE-MISMATCHED POROUS OR OTHERWISE SUBMICRON PATTERNED SINGLE CRYSTAL SUBSTRATE

[75] Inventor: Sergey Luryi, Millington, N.J.

[73] Assignee: American Telephone and Telegraph Company, AT&T Bell Laboratories Murray Hill, N.J.

[21] Appl. No.: 186,739

[22] Filed: Apr. 25, 1988

Related U.S. Application Data

[63] Continuation of Ser. No. 850,483, Apr. 10, 1986, abandoned.

[51] Int. Cl.[4] .................. H01L 29/161; H01L 29/06; H01L 29/34
[52] U.S. Cl. ......................... 357/16; 357/52; 357/55; 357/56; 357/88; 156/610; 156/603; 156/DIG. 67; 437/84; 437/131
[58] Field of Search ............ 357/16, 55, 56, 52, 357/88; 156/610, 603, DIG. 67; 437/84, 131; 372/96

[56] References Cited

U.S. PATENT DOCUMENTS

| | | | |
|---|---|---|---|
| 3,966,513 | 6/1976 | Hallais et al. | 357/16 |
| 3,970,958 | 7/1976 | Streifer et al. | 357/76 |
| 4,028,149 | 6/1977 | Deines et al. | 357/49 |
| 4,178,197 | 12/1979 | Marinau | 357/56 |
| 4,233,613 | 11/1980 | Morimoto | 357/16 |
| 4,598,164 | 7/1986 | Tiedje et al. | 357/30 R |
| 4,707,216 | 11/1987 | Murkoc et al. | 156/610 |

OTHER PUBLICATIONS

Stinson, "Gallium Arsenide Deposition Improved", p. 33, *Chemical and Engineering News* (24 Feb. 1986).
*Appl. Phys. Lett.*, 41(1), 1 Jul. 1982, "A New Silicon-on-Insulator Structure Using a Silicon Molecular Beam Epitaxial Growth on Porous Silicon", by S. Konaka et al, pp. 86–88.

*Primary Examiner*—J. Carroll
*Assistant Examiner*—Ngan V. Ngo
*Attorney, Agent, or Firm*—David I. Caplan

[57] ABSTRACT

Dislocation-free epitaxial layers on the surfaces of lattice mismatched single crystal substrates, such as germanium or gallium arsenide on silicon, can be grown provided the surfaces are suitably patterned, such as castellated or porous.

17 Claims, 2 Drawing Sheets

DISLOCATION-FREE EPITAXIAL LAYER ON A LATTICE-MISMATCHED POROUS OR OTHERWISE SUBMICRON PATTERNED SINGLE CRYSTAL SUBSTRATE

This application is a continuation of application Ser. No. 850,483, filed Apr. 10, 1986, abandoned.

FIELD OF THE INVENTION

This invention relates to devices formed by epitaxial growth and more particularly to such growth upon the porous, castellated, or otherwise two-dimensionally major surface of a signal crystal semiconductor body substrate. By "castellated" it is meant that the cross section of the substrate at the major surface is characterized by steep hills and valleys, the tops of the hills defining flat plateau surface portions that are mutually separated from one another by gaps formed by the valleys. An example of such a castellated surface is illustrated in FIGS. 1 and 2, and is discussed in further detail below. In general, by a two-dimensionally "submicron patterned" surface it is meant that the surface is characterized by flat plateaus of any arbitrary shape, each plateau having a maximum lateral extent with respect to any direction along the top surface of the plateau equal to less than a micron, with gaps formed by grooves located between the plateaus, for example, as obtained by nanometer lithography described in a paper by K. Douglas et al, entitled "Nanometer Molecular Lithography", published in *Applied Physics Letters*, Vol. 48 (10), pages 676–678 (March 1986).

BACKGROUND OF THE INVENTION

In a variety of electronic circuit contexts, it is desirable to have available epitaxial layers of lattice-mismatched materails. For example, as known in the art, since silicon is an indirect bandgap semiconductor material, neither optical senders nor speedy and sensitive optical detectors can be made of silicon. Therefore, in opto-electronic circuits it is desirable to have an epitaxial layer of a different bandgap semiconductor—such as germanium (Ge) or a direct-gap Group III-V semiconductor like gallium arsenide—on a silicon (Si) substrate, with either optical devices, such as optical sender or optical detector elements or both, being integrated in the epitaxial layer, and with the bulk of the electronic data processing circuitry being integrated in the relatively low-cost silicon substrate. Moreover, in the case of date processing circuitry where purely silicon semiconductor integrated circuit transistors would operate too slowly, it is desirable to integrate some, but not all, of the transistors in single crystal gallium arsenide semiconductor, where transistors can operate faster, and to integrate the remainder of the transistors in single crystal silicon. In such cases, the more critical data processing calculations—more critical in that the speed of these data calculations limit the overall speed of calculations—are allocated and routed to the transistors that are integrated in the gallium arsenide, whereas the less critical calculations are allocated and routed to the transistors that are integrated in the silicon. Thus, in such cases it is desirable to have single crystal gallium arsenide that has been epitaxially grown upon single crystal silicon to form a unified structure, the critical transistors being integrated in the gallium arsenide and the remaining transistors in the silicon.

On the other hand, because of the lattice mismatch between different semiconductor materials—e.g., about 0.22 Angstrom or about 4% mismatch between Ge and Si—during epitaxial growth, great stresses are unavoidably established in the region of the interface of epitaxial layer and substrate, whereby the epitaxial layer suffers in quality from such defects as lattice dislocations, so that transistors formed in the epitaxial layer do not operate properly, if at all. As the epitaxial layer is made thicker, the formation of lattice dislocation becomes more likely. For example, in order to grown upon a single crystal silicon substrate a dislocation-free epitaxial layer of $Ge_xSi_{1-x}$ having a thickness of even as little as 100 Angstrom, the Ge content must be limited to a mole fraction x less than about 0.5, whereas a mole fraction x equal to unity (pure Ge) is desirable for optical elements formed in the epitaxial layer, and in prior art such a layer (with x=1) cannot be grown dislocation-free upon a silicon substrate regardless of how small the thickness of the layer is made. More generally, it is desirable to extend the thickness range of dislocation-free heteroepitaxial layers grown upon single-crystal substrates, such as commerically available semiconductor substrates like Si, gallium arsenide (GaAs), and indium phosphide (InP).

SUMMARY OF THE INVENTION

An arbitrarily thick, dislocation-free epitaxial layer of significantly lattice-mismatched material, such as pure Ge, is grown upon the surface of a single crystal substrate, such as Si, that has been made suitable porous, castellated, or otherwise has been suitably two-dimensionally submicron patterned. In this way, it is expected that the total strain energy (per unit area of the layer) stemming from the stresses due to the lattice mismatch of the epitaxial layer with respect to the substrate will not exceed the level at which dislocations would be generated, as explained in greater detail below. Hence, the quality of the epitaxial layer will be much improved; and, thereby, dislocation-free significantly lattice-mismatched heteroepitaxial layers can be grown to greater thicknesses. By "significantly lattice-mismatched", it is meant that the substrate and epitaxial layer differ in their lattice constants by at least about 0.5% or 0.03 Angstrom units.

It should be noted that the plateau portions of the single crystal substrates all have the same crystallographic orientation. That is, because these plateaus all originate from the same single crystal substrate, their respective crystal structures have the same mutual orientations even after the original surface of the substrate has been made porous, castellated, or otherwise suitable patterned. Despite the lattice mismatch, it is expected that suitable patterning of the surface of the substrate will reduce sources of strain in the epitaxial layer so that the epitaxial layer is dislocation-free regardless of thickness, as explained in greater detail below. Such suitable patterning is characterized by plateaus and gaps whose lateral extends satisfy certain criteria. More specifically, the lateral extent of the gaps should be greater than about one-third the lateral extent of the plateaus in order to prevent formation of dislocations by superposition of strains arising from different plateaus; but the lateral extent of the gaps should not exceed approximately the lateral extent of the plateaus, in order to avoid undesirable dominance in the epitaxial layer of polycrystalline growth from areas of the substrate surface in the gaps. Moreover, the maximum lateral extent (2L) of the plateaus should not exceed a certain critical length (2L$_c$) which depends somewhat upon the desired epitaxial layer thickness; for an arbitrarily thick pure Ge layer grown on Si, this critical length (2L$_c$) is expected to be about 200 Angstrom. A similar value of the critical length is expected for growth of an arbitrarily thick gallium arsenide layer grown on Si.

It should be noted that a substrate of porous silicon—wherein gaps and plateaus both ordinarily have lateral extents of less than 100 Angstrom, typically about 35 Angstrom—satisfies all these criteria for epitaxial growth of dislocation-free pure germanium of arbitrary thickness.

BRIEF DESCRIPTION OF THE DRAWING

This invention, together with its features, advantages, and characteristics, may be better understood from the following detailed description when read in conjunction with the drawings in which.

Only for the sake of clarity, none of the drawings is drawn to scale.

DETAILED DESCRIPTION

Figure 4:
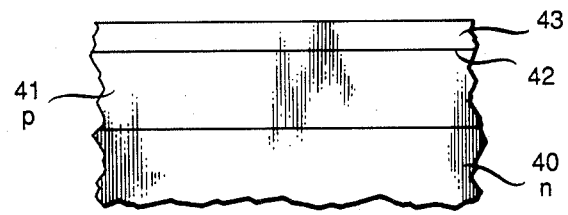
FIG. 4 is a cross-sectional diagram showing an epitaxial layer of germanium grown upon a porous single crystal silicon substrate, in accordance with a specific embodiment of the inventions.

As shown in FIG. 4, an epitaxial germanium layer 43 is located upon the surface 42 of a porous silicon semiconductor substrate portion 41. This porous substrate portion 41 is formed by the top p-type portion of a single crystal n-type bulk silicon semiconductor substrate 40 which has been made porous at this top portion, for example, by an anodic reaction with concentrated hydrofluoric acid. The anodic reaction proceeds faster in p-type than in n-type silicon, as known in the art. Such an anodic reaction is described, for example, in a paper authored by M. I. J. Beale et al., entitled "Microstructures and Foundation Mechanism of Porous Silicon" published in *Applied Physics Letters*, Vol, 46, pp, 86–88 (January 1986). Ethanol can advantageously be added to the hydrofluoric acid to suppress the formation of undesirable bubbles during the anodic reaction. The germanium layer 43 is advantageously grown by molecular beam epitaxy (MBE) upon the surface of the porous substrate after the latter has been suitably cleaned. For example, to clean the surface, the entire substrate is heated in dry oxygen to a temperature of about 300 degrees C., to oxidize a surface portion of the porous silicon; and then the substrate is heated in a vacuum chamber to a temperature of about 700 to 750 degrees C., to remove the oxide. Alternatively, the surface can be cleaned by oxidizing with the solution of hydrogen peroxide and hydrochloric acid followed by the heating in the vacuum chamber. Finally, preferably in the same vacuum chamber, the surface of the substrate is subjected to germanium MBE, as known in the art and described in more detail, for example, in a paper authored by J. C. Bean, entitled "Molecular Beam Epitaxy of Ge$_x$Si$_{1-x}$/(Si, Ge) Strained-layer Heterostructures and Superlattices" published in *Materials Research Society Symposia Proceedings*, Vol. 37, pp. 245–254 (1985).

Figure 5:
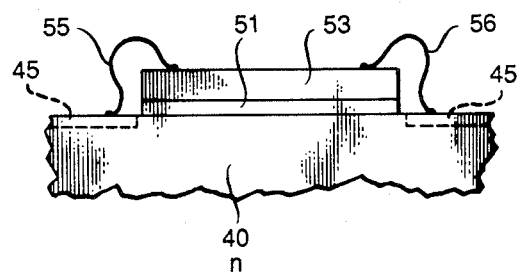
FIG. 5 is a cross-section diagram of an integrated circuit including an epitaxial layer portion of lattice-mismatched semiconductor grown in accordance with this invention.

The epitaxial layer 43 and the porous silicon layer 41 can then be patterned into relatively large area(s) as indicated in FIG. 5, whereby portions of the silicon substrate 40 are exposed. Then, one or more opto-electronic elements or devices can be fabricated in the remaining epitaxial layer 53, with very large scale integrated (VLSI) circuitry 45 being fabricated and integrated in the exposed portions of the silicon substrate 40 as known in the art. These opto-electronic devices and the integrated circuitry can then be electrically interconnected, illustratively, by metallization lines 55 and 56. Typically these lines take the form of aluminum or other suitable metal lines that are insulated from the substrate 40 and from the epitaxial layer 53 by insulating layers (not shown) except at contact areas of the respective devices and circuits through windows in the insulating layers as known in the art. Alternatively, the epitaxial layer could be originally grown upon only a limited portion of the surface of the substrate. Also, instead of, or in addition to, having opto-electornic devices fabricated in the epitaxial layer 53, electronic circuitry can be fabricated in this epitaxial layer, whereby during operation in data processing systems, the circuitry in the epitaxial layer is allocated the task of performing the more critical data calculations, i.e., the calculations that are desirably to be performed with greater speed.

Figure 1:
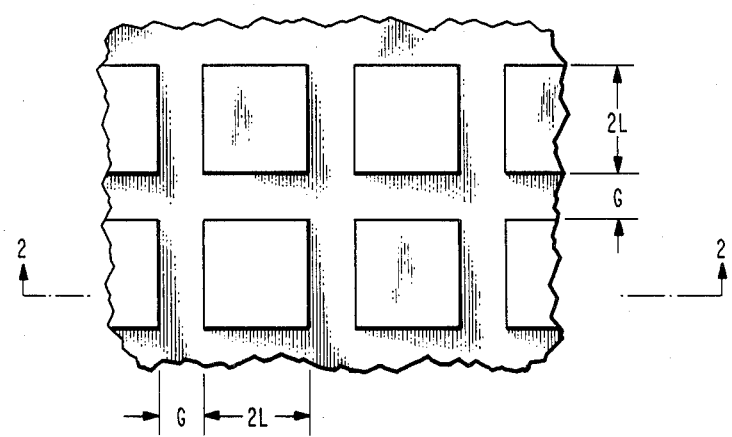
FIG. 1 is a top view diagram of a typical castellated surface region of a single crystal substrate.
Figure 2:
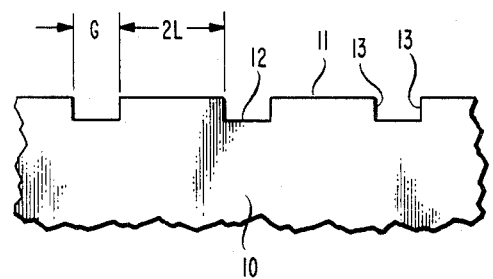
FIG. 2 is a cross-section diagram of the typical castellated surface region shown in FIG. 1.
Figure 3:
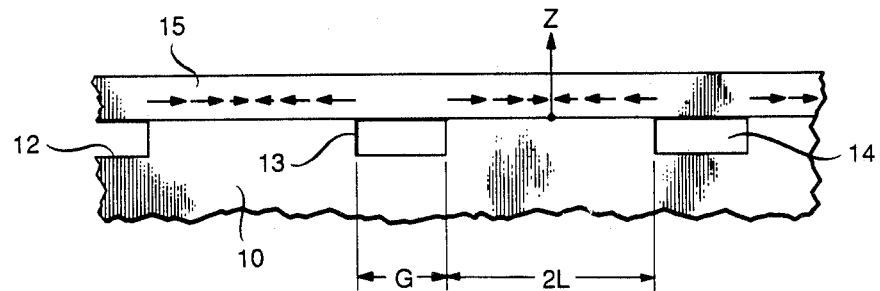
FIG. 3 is a cross-sectional diagram of an epitaxial layer grown upon the lattice-mismatched castellated surface shown in FIGS. 1 and 2, in accordance with the principles of the invention, with arrows indicating tangential stress in the epitaxial layer in cases where the horizontal lattice distance of the epitaxial layer is larger than that of the substrate.

To understand better the underlying principles of the invention, it is useful to turn to FIGS. 1, 2 and 3. Here, upon a single crystal substrate 10 having a castellated surface, an epitaxial layer 15 (FIG. 3) has been grown, with tangential stress (caused by lattice mismatch) in the layer at its interface with the substrate indicated by the arrows in FIG. 3. The castellated surface is characterized by flat plateaus 11, each of lateral extent 2L, and valleys 12 extent G, each of the valleys having vertical sidewalls 13. The valleys 14 have bottom surface 12 of lateral extent G equal to the gap between neighboring plateaus. Note that the lengths of the arrows are relatively long at the edges of the plateaus in the immediate vicinity of the vallyes and are relatively short near the midpoints of the plateaus, indicating relatively large tangential stress at the edge of the plateaus near the valleys and relatively small stress near the center of the plateaus.

The lateral extent G of the gaps, in accordance with one of the criteria of the invention, should be sufficiently large so that the strain fields that propagate through the epitaxial layer 15 from the strain sources on different plateaus do not intefere, i.e., superposition of strain fields stemming from separate strain sources is not substantial. Consequently, the physical solution to the resulting boundary value problem involving the establishing of strain throughout the epitaxial layer is characterized by exponentially decreasing values of strain as a function of distance from the interface. Thus, the strain energy per unit area of the epitaxial layer will be finite for any arbitrary thickness, no matter how large. Moreover, the strain energy decreses with decreasing lateral extent 2L of the plateaus so that for sufficiently small maximum lateral extent 2L of the plateaus, the strain energy will never exceed the threshold energy for the formation of dislocations. In particular, if 2L of plateaus on a surface of Si is less than about 200 Angstrom, then the pure Ge epitaxial layers will not have any dislocations regardless of how thick the layer may be. If the lateral extent 2L of the plateaus of Si is somewhat larger, then the pure Ge epitaxial layer will still be dislocation-free provided that its thickness if not too great. In such a case, the critical layer thickness for dislocation-free growth of pure Ge upon Si would be finite but greater than that (10 Angstrom) predicted for growth upon unpatterned (smooth) Si.

Although the invention has been described in detail with respect to a specific embodiment, various modifications can be made without departing from the scope of the invention. For example, instead of pure Ge, the dislocation-free epitaxial layer can be $Ge_xSi1-x$, with concomitant somewhat larger allowed values of lateral plateau extent 2L depending upon x, or it can be gallium arsenide. More generally, the substrate and epitaxial layers can be any lattice-mismatched crystals, semiconductors or non-semiconductors. For example, within the scope of the invention are binary, ternary, or quaternary III-V compound semiconductor alloys—generally, (In, Ga, Al)-(As, P)—grown epitaxially upon lattice-mismatched submicron-patterned III-V single crystal substrates—such as GaAs, InP, or GaP. Note that GaP is only 0.4% lattice mismatched to Si and hence is more nearly perfectly lattice-matched to Si than are other III-V compound semiconductors, but by itself GaP has an indirect gap and is not as useful for optical devices. Thus, also within the scope of the invention is the growth of any III-V lattice-mismatched (with respect to GaP) material upon, for example, a submicron patterned GaP layer which, in turn, has been epitaxially grown upon a smooth (unpatterned) surface of a silicon substrate.

What is claimed is:

1. A device comprising an epitaxial layer located upon a patterned surface of an essentially single crystal body, the epitaxial layer and the body being significantly lattice-mismatched, the patterned surface characterized by a plurality of flat plateaus with gaps formed by grooves situated between the plateaus, each of the plateaus having a maximum lateral extent of less than a micron with respect to any direction along the top surface of the plateau.

2. The device of claim 1 in which the epitaxial layer is essentially germanium and the body is essentially silicon.

3. The device of claim 2 in which each of the plateaus has a lateral extent of less than about 200 Angstrom in any direction along the top surface of the plateau, and the epitaxial layer has a thickness of at least about 100 Angstrom.

4. The device of claim 3 in which neighboring plateaus are separated from one another by gaps at least about 60 Angstrom wide.

5. The device of claim 1 in which the patterned surface is essentially porous silicon.

6. The device of claim 5 in which the porous silicon is characterized by plateaus each having a top surface whose lateral extent is less than 100 Angstrom in any direction.

7. The device of claim 1 in which the epitaxial layer is essentially gallium arsenide and the body is essentially silicon.

8. The device of claim 7 in which the patterned surface is characterized by plateaus each having a top surface whose lateral extent is less than about 100 Angstrom in any direction.

9. The device of claim 8 in which neighboring plateaus are separated by gaps at least 30 Angstrom wide.

10. The device of claim 1 in which the widths of the gaps are at least about one-third the maximum lateral extent of one of the plateaus.

11. The device of claim 1 in which the single crystal body includes an epitaxial layer of first material grown upon a medium of second material different from the first material, and in which the patterned surface comprises a surface of the epitaxial layer.

12. The device of claim 11 in which the first material is essentially galliuim phosphide and the second material is essentially silicon.

13. The device of claim 1 in which an optoelectronic element is formed in the epitaxial layer.

14. The device of claim 1 in which electronic circuitry is integrated in the body.

15. The device of claim 14 in which an optoelectronic element is formed in the epitaxial layer and is electrically inter-connected with the electronic circuitry.

16. The device of claim 15 in which the body is essentially silicon.

17. The device of claim 14 in which further electronic circuitry is formed in the epitaxial layer and is electrically interconnected with the electronic circuitry integrated in the body.

* * * * *